US006583672B2

(12) United States Patent
Deckman et al.

(10) Patent No.: US 6,583,672 B2
(45) Date of Patent: Jun. 24, 2003

(54) METHOD FOR CONTROLLING BIAS IN AN ACTIVE GRID ARRAY

(75) Inventors: Blythe C. Deckman, Corona, CA (US); David B. Rutledge, Pasadena, CA (US)

(73) Assignee: California Institute of Technology, Pasadena, CA (US)

( * ) Notice: Subject to any disclaimer, the term of this patent is extended or adjusted under 35 U.S.C. 154(b) by 0 days.

(21) Appl. No.: 09/876,835

(22) Filed: Jun. 5, 2001

(65) Prior Publication Data

US 2002/0024387 A1 Feb. 28, 2002

Related U.S. Application Data

(60) Provisional application No. 60/211,252, filed on Jun. 13, 2000.

(51) Int. Cl.[7] .................................................. H03F 3/60
(52) U.S. Cl. ........................ 330/286; 330/295; 330/296
(58) Field of Search ................................. 330/286, 295, 330/296, 307, 308, 252

(56) References Cited

U.S. PATENT DOCUMENTS

| | | | | |
|---|---|---|---|---|
| 2,957,143 A | * | 10/1960 | Enloe | 330/30 |
| 4,942,369 A | * | 7/1990 | Nakagawara et al. | 330/296 |
| 5,317,173 A | | 5/1994 | Sovero | |
| 6,400,226 B2 | * | 6/2002 | Sato | 330/286 |

OTHER PUBLICATIONS

DeLiso, Michael P., et al., "Modeling and Performance of a 100–Element pHEMT Grid Amplifier," *IEEE Transactions on Microwave Theory and Techniques*, vol. 44, No. 12, pp. 2136–2144, Dec. 1996.
Kim, M., et al., "A 100–Element HBT Grid Amplifier," *IEEE Transactions on Microwave Theory and Techniques*, vol. 41, No. 10, pp. 1762–1771, Oct. 1993.
Kim, Moonil, et al., "A Grid Amplifier," *IEEE Microwave and Guided Wave Letters*, vol. 1, No. 11, p. 322, Nov. 1991.
Liu, C. M., et al., "A Millimeter–Wave Monolithic Grid Amplifier," *Int. Journal of Infrared and Millimeter Waves*, vol. 16, No. 11, Nov. 1995.

* cited by examiner

*Primary Examiner*—Henry Choe

(57) ABSTRACT

The present invention relates to a bias tracking network that manipulates the DC value of the control voltage applied to the active devices in each quasi-optic cell within an array of cells. The purpose of this network is to compensate for variations in the main DC bias supply voltage provided to each cell. In one embodiment, the bias tracking network includes a set of resistive voltage dividers at the boundary of each cell, together with resistors inserted within the conductors that carry a reference voltage from which the control voltage for each cell is derived. This impedance network introduced at each cell boundary causes the control voltage to "track" the variation in the voltage of the return lead (i.e., the "ground lead") at each cell in the array, in order to maintain a consistent (or desired) control voltage distribution to each cell in the array.

18 Claims, 3 Drawing Sheets

METHOD FOR CONTROLLING BIAS IN AN ACTIVE GRID ARRAY

CROSS-REFERENCE TO RELATED APPLICATIONS

This application claims the benefit of U.S. Provisional Application No. 60/211,252, filed on Jun. 13, 2000.

STATEMENT AS TO FEDERALLY SPONSORED RESEARCH

The U.S. Government may have certain rights in this invention pursuant to ARO Grant No. DAA G55-98-1-0001 awarded by the U.S. Army and ONR Grant No. N66 001-96-C-8627.

BACKGROUND OF THE INVENTION

1. Field of the Invention

This invention relates to quasi-optic grid arrays, and, in particular, to techniques for controlling the distribution of dc bias across such arrays and improved arrays incorporating such techniques.

2. Description of Related Art

Broadband communications, radar and other imaging systems require the transmission of radio frequency ("RF") signals in the microwave and millimeter wave bands. In order to efficiently achieve the levels of output transmission power needed for many applications at these high frequencies, a technique called "power combining" has been employed, whereby the output power of individual components are coupled, or combined, thereby creating a single power output that is greater than an individual component can supply. Conventionally, power combining has used resonant waveguide cavities or transmission-line feed networks. These approaches, however, have a number of shortcomings that become especially apparent at higher frequencies. First, conductor losses in the waveguide walls or transmission lines tend to increase with frequency, eventually limiting the combining efficiency. Second, these resonant waveguide cavities or transmission-line combiners become increasingly difficult to machine as the wavelength gets smaller. Third, in waveguide systems, each device often must be inserted and tuned manually. This is labor-intensive and only practical for a relatively small number of devices.

Several years ago, spatial power combining using "quasi-optics" was proposed as a potential solution to these problems. The theory was that an array of microwave or millimeter-wave solid state sources placed in a resonator could synchronize to the same frequency and phase, and their outputs would combine in free space, minimizing conductor losses. Furthermore, a planar array could be fabricated monolithically and at shorter wavelengths, thereby enabling potentially thousands of devices to be incorporated on a single wafer.

Since then, numerous quasi-optical devices have been developed, including detectors, multipliers, mixers, and phase shifters. These passive devices continue to be the subject of ongoing research. Over the past few years, however, active quasi-optical devices, namely oscillators and amplifiers, have evolved. One benefit of spatial power combining (over other methods) using quasi-optics is that the output power scales linearly with chip area. Thus, the field of active quasi-optics has attracted considerable attention in a short time, and the growth of the field has been explosive.

It is believed that the first quasi-optical grid array amplifier was a grid developed by M. Kim et al at the California Institute of Technology. This grid used 25 MESFET differential pairs, demonstrating a gain of 11 dB at 3 GHz. As shown in FIG. 1, a typical grid amplifier 10 is an array of closely-spaced differential pairs of transistors 14 on an active grid 12 sandwiched between an input and output polarizer, 18, 24. An input signal 16 passes through the horizontally polarized input polarizer 18 and creates an input beam incident from the left that excites rf currents on the horizontally polarized input antennas 20 of the grid 12. These currents drive the inputs of the transistor pair 14 in the differential mode. The output currents are redirected along the grid's vertically polarized antennas 22, producing a vertically polarized output beam 30 via an output polarizer 24 to the right.

The cross-polarized input and output affords two important advantages. First, it provides good input-output isolation, reducing the potential for spurious feedback oscillations. Second, the amplifier's input and output circuits can be independently tuned using metal-strip polarizers, which also confine the beam to the forward direction. Numerous grid amplifiers have since been developed and have proven thus far to have great promise for both military and commercial RF applications and particularly for high frequency, broadband systems that require significant output power levels (e.g. >5 watts) in a small, preferably monolithic, package. Moreover, a resonator can be used to provide feedback to couple the active devices to form a high power oscillator.

One challenge in the design of active grid arrays relates to DC biasing of the differential pair cells in the array. Unfortunately, since any practical design requires the whole array to be biased with a single bias bus, one specific problem that affects the operation of active grid arrays is the uneven distribution of bias voltage across a given array of cells or a row of cells in an array. Due to the finite conductivity and limited thickness of metal lines used in actual circuits, grid arrays that require appreciable bias current to be distributed among many active devices (e.g., transistors) from a single source at the edge of the grid may suffer from unequal distribution of DC power. Specifically, the cells in the middle of the array tend to get less bias current than those closer to the dc source. This DC power distribution problem limits the effectiveness of large, high-power grid array components (e.g., grid amplifiers and grid oscillators).

It would thus be desirable to have a grid array in which the power distribution across the entire array could be controlled, by either providing an equal distribution of DC bias to each cell in the array or by providing a different, but desired, power distribution at the control of the array designer. The present invention fulfills this need.

SUMMARY OF THE INVENTION

The present invention, which addresses this need, resides in a method of controlling the distribution of a bias in a periodic array of electronic devices, such as a quasi-optic grid array. The method includes the steps of first sensing the voltage drop on the bias line resulting from the intrinsic resistance in the bias line at either all or selected electronic devices in the array, and then applying a prescribed bias voltage via an impedance network at the control input of either selected or all devices in the array based upon the sensed voltage drop. In this way, the bias voltages to each control input of either the selected or all electronic devices in the array can by tailored and thus will not suffer from an undesirable, non-ideal, and/or uneven bias distribution across the array.

More particularly, a method of controlling the distribution of bias in a periodic array of active cells that is biased with a DC bias supply, a bias supply line and a bias-return conductor line, is disclosed. The method includes sensing the voltage difference between consecutive cells on the bias-return conductor line resulting from the internal conductor resistance in the bias-return conductor line; and based on the sensed voltage difference, applying to each cell a prescribed control bias voltage. The prescribed control voltage is applied via an impedance network at each cell along the array that allows the control bias voltage to track the voltage difference on the return line.

The impedance network of the present invention includes a voltage divider circuit disposed between the bias-return current line and a reference voltage conductor return line, and a tracking resistance inserted in the reference-voltage conductor return line and is connected to the voltage divider circuit.

In one preferred embodiment, the impedance network maintains a relatively constant control bias voltage distribution to each cell in the array relative to the sensed voltage on the bias return line at each cell. In this way, the input control biasing voltage ($V_{gs}$ in the case of FET's) is the same across the entire grid array, regardless of the size of the array. In one specific embodiment, the active cells are differential pair amplifiers and the periodic array is a grid amplifier.

An improved periodic active grid array is also disclosed by the present invention. The array includes (a) a plurality of active cells that are combined at their outputs in a periodic arrangement via bias-supply conductors; (b) a DC bias voltage source that supplies bias to each of the cells; (c) a bias return conductor line connected to each cell, the line having internal resistances, $R_{cond}$, disposed along the bias-return conductor line; (d) a reference voltage source that supplies a voltage to the bias return conductor line; and (e) a bias distribution impedance network disposed between the bias return conductor line and an auxiliary reference-voltage return conductor line that controls the distribution of bias in a periodic array. In the preferred embodiment, the bias distribution impedance network includes three resistors. A first resistor is disposed between the bias return conductor line and a control input of a cell, and a second resistor is connected to the first resistor and the control input and at the other end to the reference-voltage conductor line. The two resistors define a voltage divider circuit that establishes, at each cell, the voltage at the control lead relative to the varying voltages on the bias-return conductor line. The third resistor is a tracking resistor, $R_{track}$, disposed between the second resistor of each cell and the reference-voltage conductor line, that causes the voltage on the reference-voltage control line at each cell to have a specific relationship to the voltage on the bias-return line.

In the embodiments where the control input bias is desired to be at least substantially constant throughout the array, the value of each $R_{track}$ is defined by the equation: $C(R_{track}+R_{cond})=(1-C)R_{cond}$, where C is a predetermined fraction of the current that flows from the main current return line that may be diverted.

In yet an even more particular aspect of the invention, an improved quasi-optic grid array that amplifies an RF input beam in free space is disclosed. The array includes (a) a plurality of differential pair unit cells, each having two control inputs that receive the input beam, two outputs that radiate the amplified beam and common cathodes, the cells being interconnected at their outputs in a periodic arrangement via bias-supply conductor lines, and a bias-return conductor line; (b) a DC bias voltage source connected to the bias supply conductor lines that supplies output bias to each of the cells; (c) a reference voltage source. The bias return conductor lines have an internal resistance, $R_{cond}$, disposed along the bias-return conductor line. Finally, a bias distribution impedance network is introduced between the bias return conductor line and an auxiliary reference-voltage return conductor line that controls the distribution of bias in a periodic array.

Finally, in another aspect of the present invention, the periodic active grid array of the present invention includes means for establishing, at selected cells, the voltage at the control lead relative to the varying voltages on the bias-return conductor line, and means for controlling a prescribed control bias voltage to be applied to each cell.

DETAILED DESCRIPTION OF THE INVENTION

Figure 1:
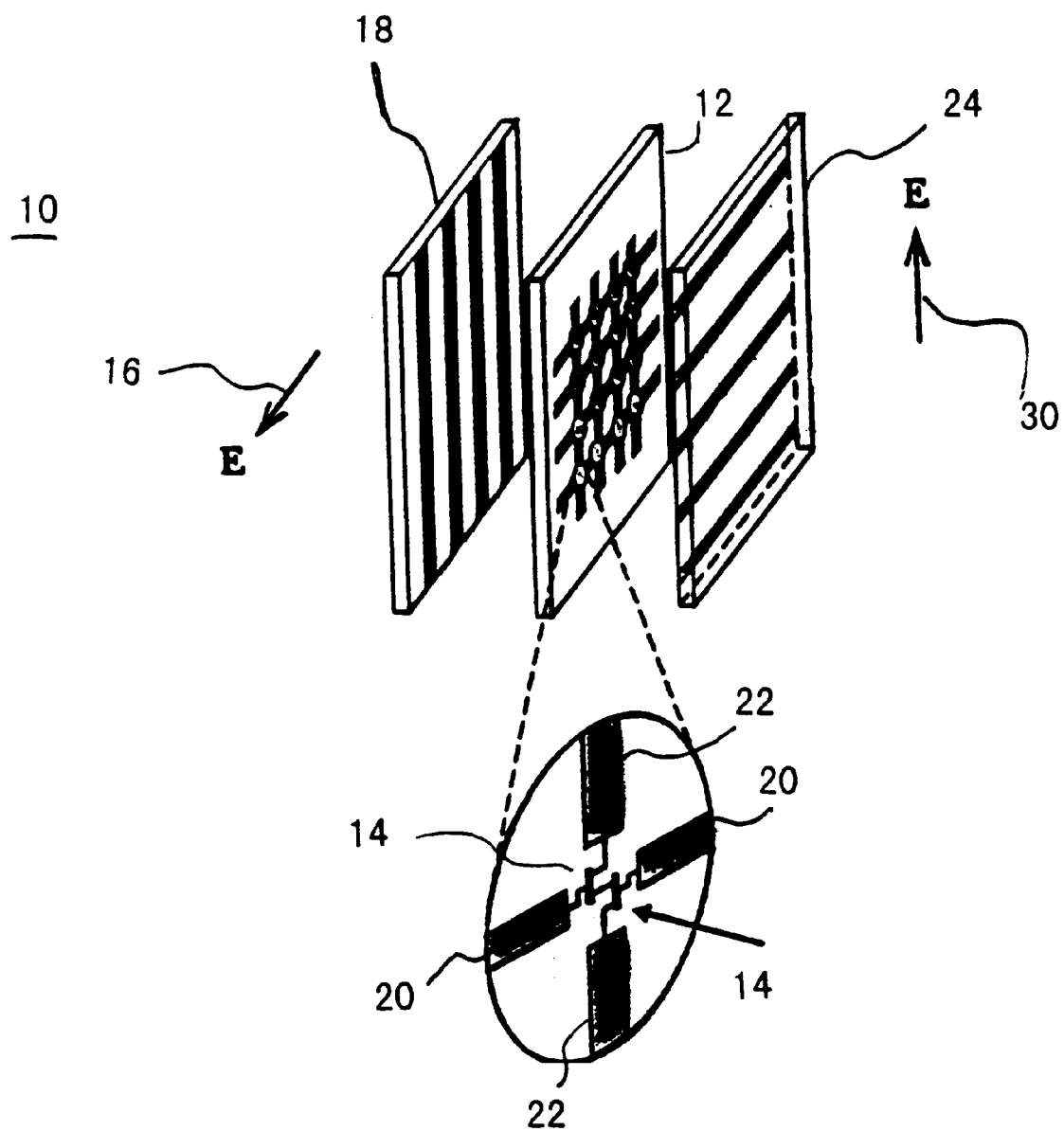
FIG. 1 is a perspective view of a conventional quasi-optic grid amplifier.

The present invention relates to a bias-tracking network that manipulates the DC value of the control voltage applied to the active devices in each quasi-optic cell within an array of cells. A fundamental purpose of this network is to compensate for variations in the main DC bias supply voltage provided to each cell. These variations in the main supply voltage result from voltage drops caused by inherent, or intrinsic, resistance in the conductors that distribute the DC power. The term "active device" as used herein denotes any active structure or active structure architecture that may be used in a periodic array, such as a quasi-optic unit cell. In one embodiment, the active device includes a pair of transistors connected as a differential pair as shown in the magnified view of a conventional single cell structure shown in FIG. 1.

Further, it should be understood that the present invention applies to any type of periodic array, such as a quasi-optic active grid array structure, including a grid amplifier or grid oscillator. Moreover, the invention is independent of the type of active devices that comprise the unit cells of the array. Thus, as is well understood, the control voltage to be manipulated is the gate-to-source voltage, $V_{gs}$ for a FET, such as a pHEMT, or the base-to-emitter voltage, $V_{be}$, in the case of a bipolar transistor.

Figure 2A:
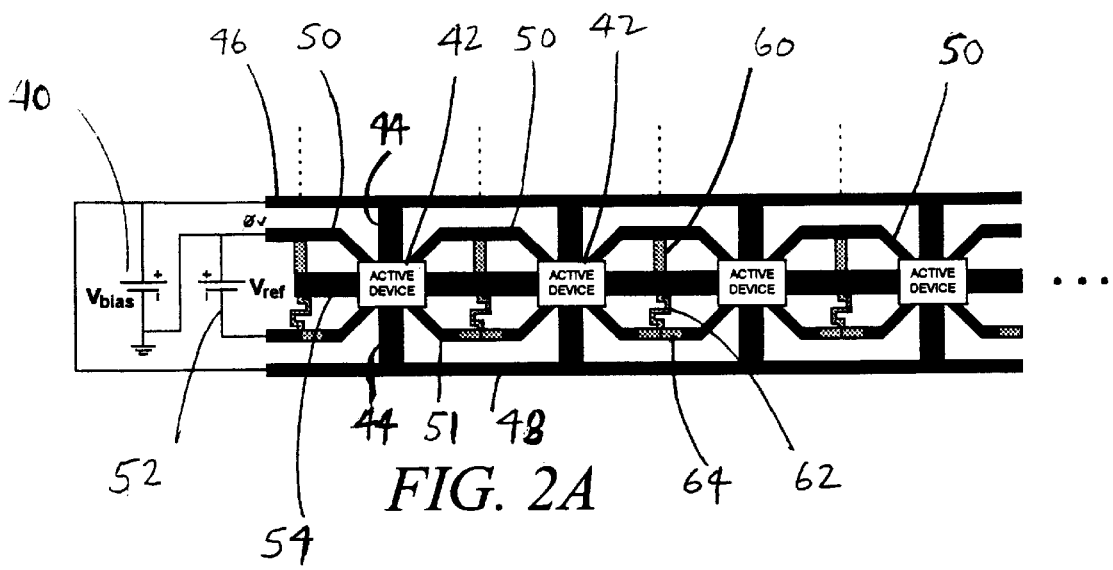
FIG. 2A is a schematic of a portion of a row of unit cells in grid array showing the bias compensation technique of the present invention.
Figure 2B:
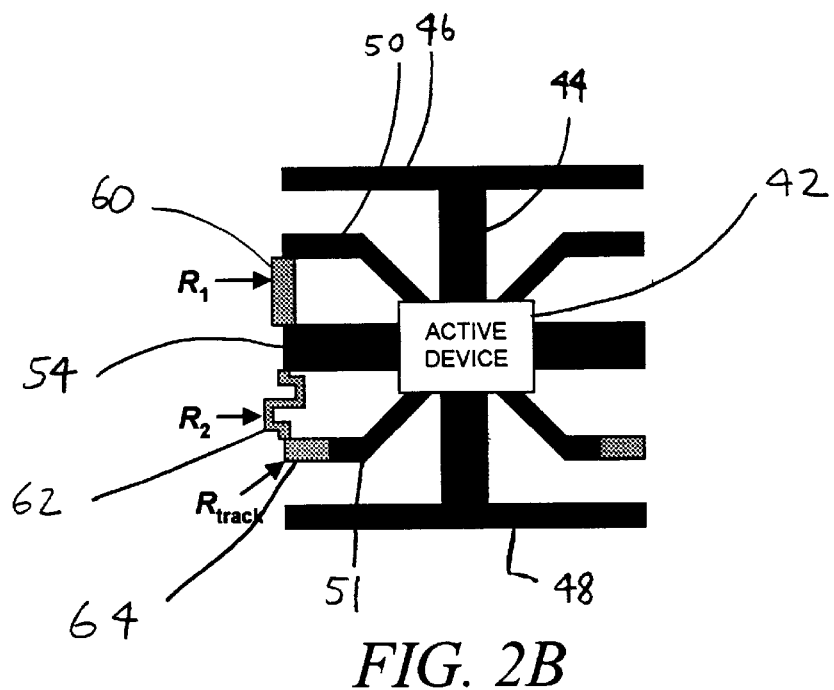
FIG. 2B is a close up view of a single cell shown in FIG. 2A.

In the preferred embodiment, as seen best in FIG. 2B, the bias tracking network is an impedance network 59, and more specifically, a set of resistive voltage dividers 60, 62 located at the boundary of each cell, together with "tracking" resistors 64 inserted within the conductors that carry a reference voltage from which the control voltage (e.g., gate bias) for each cell is derived. This impedance network introduced at each cell boundary causes the control voltage to "track" the variation in the voltage of the return lead (i.e., the "ground lead") at each cell in the array, in order to maintain a consistent control voltage distribution to each cell in the array. Alternatively, the resistor network can be intentionally altered for each cell in order to tailor the control voltage applied to each cell (or group of cells) in the array.

FIGS. 2A and 2B illustrate one preferred physical layout of a portion of a row of an arbitrary-sized grid array incorporating the bias tracking network of the present invention. The dotted vertical lines in FIG. 2A represent the dividing lines between the unit cells, one of which is illustrated in FIG. 2B. Each cell has two outputs (i.e. drain terminals in the case of FET design, or collector terminals in the case of BJT transistors, which inside the active device 42, but not explicitly shown) that are connected to vertical output leads 44 that radiate an output beam. The output leads are in turn combined together via upper and lower output bias lines 46 and 48, respectively. At one end of the array, a relatively large bias voltage source, $V_{bias}$, 40 is introduced in order to supply a direct current bias to the outputs via the output bias lines 46, 48. $V_{bias}$'s negative terminal is grounded. The current returns to the $V_{bias}$ ground 41 via a bias-return conductor line 50.

Each arm of the bias-return conductor line 50 is assumed to have a resistance $R_{cond}$ 69 (shown in FIG. 3) resulting from the finite conductivity of the conductor material. While the arm closest to the voltage source $V_{bias}$ 40 is directly connected to ground and thus is at 0 volts, the unavoidable resistances $R_{cond}$ 69 in the bias-return conductor line 50 that carries significant current cause the voltage on subsequent arms on this line 50 to vary (increase) from one cell to next within the array (moving away from the source 40). The control input line, however, supplies a relatively constant voltage on the control lines 54. Thus, the control input voltage, $V_{gs}$, which, as understood, is the voltage difference between the voltage at the control lead 54 and the voltage at the source (which is connected to the reference voltage conductor line 51 at the edge of each cell) varies from cell to cell as the voltage increases down the return line.

In order to combat this undesirable voltage change, a DC reference voltage $V_{ref}$ 52 is introduced at the edge of the array having its positive terminal connected to the bias return conductor line 50 and a negative terminal connected to a reference-voltage conductor line 51. Next, at the two edges of each cell in the array, an impedance network 59 of three resistors is introduced. Resistors $R_1$ 60 and $R_2$ 62 comprise a resistive voltage divider that establishes the voltage at the control lead 54 relative to the voltages present on the bias-return conductor line 50 and the reference-voltage conductor line 51 at the edge of each cell. The third resistor in the network, $R_{track}$, 64 causes the voltage on the reference-voltage conductor to have a specific relationship (at each cell edge) to the voltage on the bias-return conductor. These three resistors comprise the bias tracking network 59 of the present invention that is placed at each cell interface.

Figure 3:
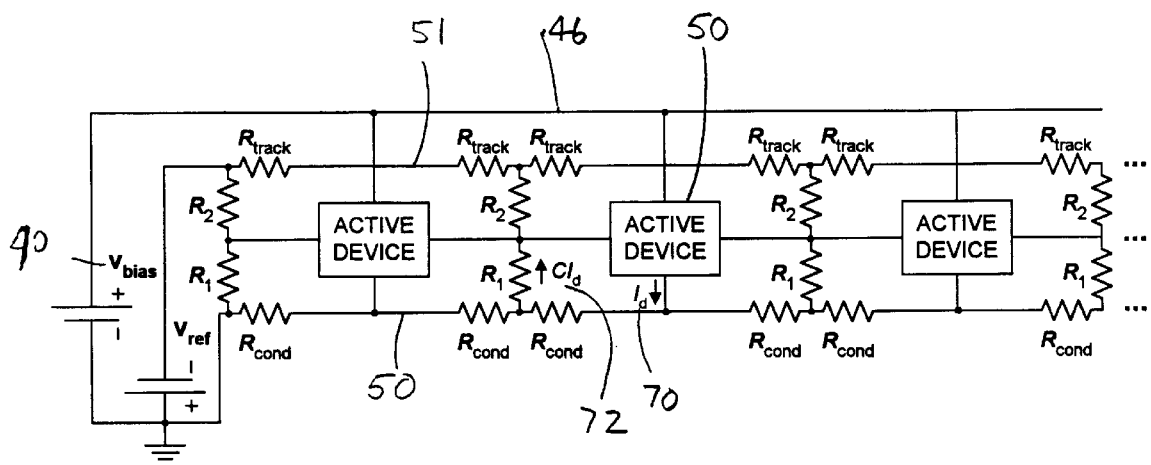
FIG. 3 is an electrical equivalent circuit of the schematic shown in FIG. 2A.

To further understand the operation of this bias tracking network, FIG. 3 shows a circuit schematic diagram of the grid array section shown in FIG. 2A. Consider an array in which it is desired that the active devices within each cell should conduct an amount of current, $I_d$, 70 that then must return to the power supply 40. A small fraction of this current (e.g., 1/20 of $I_d$) can be diverted from the bias-return line 50, through the resistors $R_1$ 60 and $R_2$ 62, and allowed to flow through the reference-voltage conductor line 51 and back to the reference voltage supply 52. Call this fraction C. It is assumed here that $CI_d$ is large compared with the current drawn by the control terminal of the active device (e.g., the gate of a pHEMT). If $R_{track}$ 64 is chosen such that $C(R_{track}+R_{cond})=(1-C)R_{cond}$, then the cell-to-cell variations in voltage on the reference-voltage conductor line 51 will track the cell-to-cell variations in voltage on the bias-return conductor line 50. This will cause the voltage difference between the bias-return conductor line 50 and the control lead 54 ($V_{gs}$ for a pHEMT) to be the same for every cell in the array, which in turn will result in essentially equal bias currents for each cell in the array.

Alternatively, it is possible to adjust the value of $R_{track}$ 64 to a value that is different from the one arrived from the above equation so as to cause the cells to have a specified cell-to-cell current variation, such as to make the cells in the center of the array carry more current than those near the edge of the array, which can be useful in selected applications.

As yet a further variation, it is possible to create a grid array wherein less than all cells in the array are biased using the technique of the present invention. In particular, if desired, a grid array may be designed wherein the voltage drop on the bias line at only some of the cells is sensed, while applying the prescribed biasing voltage to all of the cells. It is also conceivable that some of the cells may be self-biased so that the biasing voltage (i.e. the bias distribution impedance network) would be not applied to those cells.

Having thus described exemplary embodiments of the invention, it will be apparent that further alterations, modifications, and improvements will also occur to those skilled in the art. Further, it will be apparent that the technique of the present invention is not limited to a method for adjusting bias in periodic grid arrays such a grid amplifier. Rather, the present invention can be applied to control the DC bias voltage of any type of periodic array of electronic devices. Accordingly, the invention is defined only by the following claims.

We claim:

1. A method of controlling the distribution of a bias in a periodic array of electronic devices, comprising:

using a voltage divider circuit disposed between a bias-return current line and a reference voltage conductor return line of an impedance network to provide a mechanism for sensing the voltage drop on the bias line resulting from the intrinsic resistance in the bias line at selected electronic devices in the array each of which is configured and coupled to receive a bias current; and applying a prescribed bias voltage via the impedance network at the control input of selected devices in the array based upon the sensed voltage drop to control the bias current.

2. The method of claim 1, wherein the voltage drop on the bias line is individually sensed at each electronic device in the array and a prescribed bias voltage is applied to each device based on the sensed voltage drop specific to that device.

3. A method of controlling the distribution of bias in a periodic array of active cells that is biased with a DC bias supply, a bias supply line and a bias-return conductor line, comprising:

sensing a voltage difference between consecutive cells on the bias-return conductor line resulting from the internal conductor resistance in the bias-return conductor line; and based on the sensed voltage difference, applying to each cell a prescribed control bias voltage to control a DC current flowing through the active devices, wherein the impedance network includes a voltage divider circuit disposed between the bias-return currant line and a reference voltage conductor return line, and a tracking resistance inserted in the reference-voltage conductor return line that is connected to the voltage divider circuit.

4. The method of claim 3, wherein the prescribed control voltage is applied via an impedance network at each cell along the array that allows the control bias voltage to track the voltage difference on the bias-return conductor line.

5. The method of claim 3, wherein the impedance network maintains a substantially constant control bias voltage distribution to each cell in the array relative to the sensed voltage on the bias return line at each cell.

6. The method of claim 3, wherein the active cells are differential pair amplifiers and the periodic array is a grid amplifier.

7. A periodic active grid array, comprising:
   a plurality of active cells that are combined at their outputs in a periodic arrangement via bias-supply conductors, each having
   a DC bias voltage source that supplies bias to each of the cells;
   a reference voltage source;
   a bias return conductor line connected to each cell, the line having internal resistances, $R_{cond}$, disposed along the bias-return conductor line; and
   a bias distribution impedance network disposed between the bias return conductor line and an auxiliary reference-voltage return conductor line that controls the distribution of bias in a periodic array.

8. The array of claim 7, wherein the bias distribution impedance network includes
   a first resistor disposed between the bias return conductor line and a control input of a cell;
   a second resistor connected to the first resistor and control input and at the other end to the reference-voltage conductor line;
   the first and second resistor defining a voltage divider circuit that establishes, at each cell, the voltage at the control lead relative to the varying voltages on the bias-return conductor line; and
   a tracking resistor, $R_{track}$, disposed between the second resistor of each cell and the reference-voltage conductor line, that causes the voltage on the reference-voltage control line at each cell to have a specific relationship to the voltage on the bias-return line.

9. The array of claim 7, wherein the value of the $R_{track}$ is defined by the equation:

$$C(R_{track}+R_{cond})=(1-C)R_{cond},$$

where C is a predetermined fraction of the current that flows from the main current return line that may be diverted.

10. A quasi-optic grid array that amplifies an RF input beam in free space, comprising:
   a plurality of differential pair unit cells, each having two control inputs that receive the RF input beam, two outputs that radiate an amplified beam and common cathodes, the cells being interconnected at their outputs in a periodic arrangement via bias-supply conductor lines, and a bias-return conductor line;
   a DC bias voltage source connected to the bias-supply conductor lines that supplies an output bias to each of the cells; and
   a reference voltage source;
   the bias return conductor lines having an internal resistance, $R_{cond}$, disposed along the bias-return conductor line; and
   a bias distribution impedance network disposed between the bias return conductor line and an auxiliary reference-voltage return conductor line that controls the distribution of bias in a periodic array.

11. A periodic active grid array that includes active cells having control leads to be biased and interconnected via a bias-return conductor line, comprising:
   means for establishing, at a first group of cells selected from the grid array, the voltage at the control lead relative to the varying voltages on the bias-return conductor line;
   means for controlling a prescribed control bias voltage to be applied to a second group of selected cells; and
   a voltage divider circuit disposed between the bias-return current line and a reference voltage conductor return line of an impedance network in each cell.

12. The grid array of claim 11, wherein the second group of selected cells includes all the active cells in the grid array.

13. The grid array of claim 11, wherein the first group of selected cells includes all of the active cells in the grid array.

14. The method of claim 1, further comprising configuring the impedance network to substantially equalize bias currents in the selected devices.

15. The method of claim i, further comprising separately biasing other devices in the array without the sensing and the control through the impedance network for the selected devices.

16. The method of claim 1, further comprising applying different prescribed bias voltages to different groups of the selected devices.

17. The array of claim 7, wherein each active cell includes a pair of transistors connected to each other in a differential configuration.

18. The array of claim 8, wherein the tracking resistor for a first active cell has a resistance different from the tracking resistor for a second active cell that is at a different location in the array.

* * * * *